(12) United States Patent
Bonin et al.

(10) Patent No.: US 8,125,057 B2
(45) Date of Patent: Feb. 28, 2012

(54) MAGNETIC SHIELDING FOR INTEGRATED CIRCUIT

(75) Inventors: Wayne Allen Bonin, North Oaks, MN (US); Dadi Setiadi, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 441 days.

(21) Appl. No.: 12/498,574

(22) Filed: Jul. 7, 2009

(65) Prior Publication Data

US 2011/0007540 A1    Jan. 13, 2011

(51) Int. Cl.
*H01L 23/552* (2006.01)
*H05K 9/00* (2006.01)
*G11C 7/02* (2006.01)
(52) U.S. Cl. ........... 257/659; 257/729; 361/816; 365/53
(58) Field of Classification Search .................. None
See application file for complete search history.

(56) References Cited

U.S. PATENT DOCUMENTS

| 6,429,044 | B1 | 8/2002 | Tuttle | |
|---|---|---|---|---|
| 6,515,352 | B1 | 2/2003 | Spielberger et al. | |
| 6,906,396 | B2 | 6/2005 | Tuttle et al. | |
| 7,119,419 | B2 | 10/2006 | Kato et al. | |
| 7,183,617 | B2 | 2/2007 | Wang et al. | |
| 2006/0237823 | A1* | 10/2006 | Spielberger et al. | 257/659 |
| 2008/0266938 | A1* | 10/2008 | Molla et al. | 365/158 |
| 2009/0045488 | A1* | 2/2009 | Chang et al. | 257/659 |

* cited by examiner

*Primary Examiner* — Alonzo Chambliss
(74) *Attorney, Agent, or Firm* — Mueting Raasch & Gebhardt PA

(57) ABSTRACT

A shielded integrated circuit structure including an integrated circuit having a plurality of functional elements thereon, and a tiled array comprising a plurality of shielding elements, each functional element having one of the plurality of shielding elements proximate thereto. The shielding elements comprise a magnetic material having a saturation less than or equal to 20,000 gauss.

20 Claims, 3 Drawing Sheets

MAGNETIC SHIELDING FOR INTEGRATED CIRCUIT

BACKGROUND

Electronic devices including integrated circuits (ICs) can be sensitive to various forms of electronic and/or magnetic interference.

Magnetic storage elements are used in various solid state memory applications, such as magnetic random access memory (MRAM) and spin torque random access memory (STRAM). Magnetic elements, however, are sensitive to stray magnetic fields; these magnetic fields may affect the reading and/or writing processes of the elements. Stray magnetic fields are known to range up to 50 Oe for general applications and up to 200 Oe for certain special applications, such near the voice coil motor of a disc drive. To ensure proper operation of the memory, any stray field should to be attenuated to a maximum of 10 Oe in the plane of the memory chip.

One problem with magnetic shielding designs is that there is limited space available in modern semiconductor packages for the magnetic shields. Another problem is cost associated with the shielding. Shielding a 12.5 mm square chip from a 200 Oe field requires a relatively high moment shielding material, such as an Fe—Si electrical steel that saturates at 18,000 gauss, at a thickness of at least 200 μm. For a Ni—Fe alloy that saturates at 12,000 gauss, a thickness of at least 300 μm is required. To reduce assembly cost it would be desirable to plate the shield directly on the top of the integrated circuit chip, but stress, material cost, process time and lack of physical space all make a 200 to 300 μm plated shield commercially impractical.

Other solutions for shielding from stray fields are needed.

BRIEF SUMMARY

The present disclosure relates to magnetic shield for integrated circuits. The shield is composed of a tiled structure consisting of an array of magnetic shielding elements, with non-magnetic spaces between the shielding elements.

In one particular embodiment, this disclosure provides a shielded integrated circuit structure. The structure includes an integrated circuit having a plurality of functional elements thereon, and a tiled shield array in close proximity to the functional elements. The array is formed of a plurality of shielding elements each comprising a magnetic material having a saturation less than or equal to 20,000 gauss. Each functional element has a shielding element proximate thereto.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
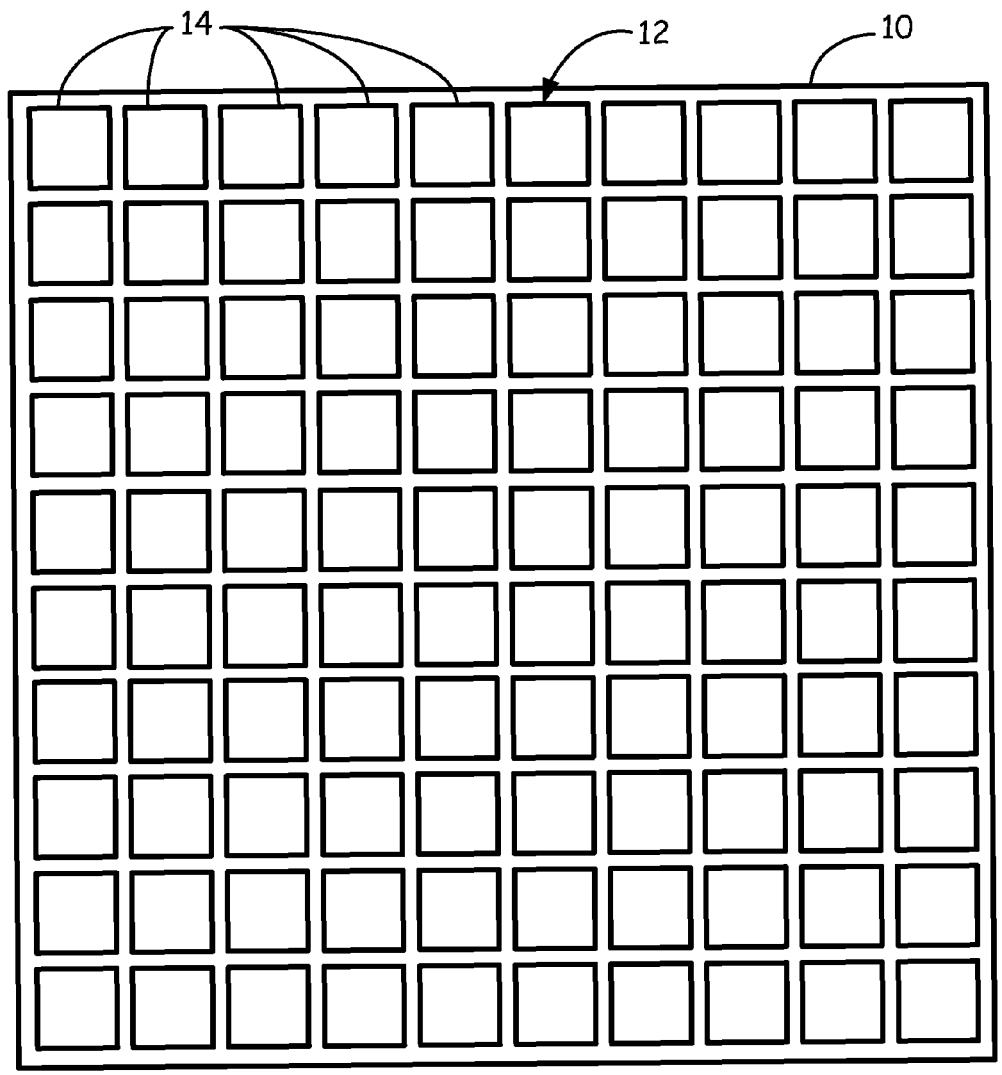
FIG. 1 is a schematic top view of a tiled array of magnetic shielding elements on an integrated chip.

The present disclosure describes various shielding structures for integrated circuit (IC) chips that include a tiled array of magnetic shielding elements, with non-magnetic spaces between the shielding elements. The tiled array reduces the required thickness of the total shield material, compared to a single large shield. With this reduced thickness, the tiled array of elements is more cost-effective for direct electroplating on the IC chip. The tiled shield structure may be used in conjunction with solid bulk magnetic shielding foil placed under and/or over the IC chip for greater stray field attenuation.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above", "below", etc. may be used in this disclosure. These terms should not be construed as limiting the position or orientation of a structure, but should be used as providing spatial relationship between the structures.

In some embodiments, the present disclosure relates to memory cell architecture that consists generally of a number of blocks of storage elements surrounded by row and column driver and decoder circuitry. The storage elements have a shield proximate thereto, to protect the elements from unwanted (stray) fields; stray magnetic fields are one type of field from which protection is provided. Since the storage elements are sensitive to stray fields, it is necessary to shield the storage elements. The present disclosure provides a tiled array of shielding elements positioned to shield the storage elements.

While the present disclosure is not so limited, an appreciation of various aspects of the disclosure will be gained through a discussion of the examples provided below.

FIG. 1 is a top view of an integrated circuit (IC) chip 10 having an array 12 of individual shielding elements 14 in close proximity. In the illustrated embodiment, array 12 is a 10×10 array of shielding elements 14. Other embodiments may be, for example 100×100 arrays, 20×20 arrays, 1000×1000 arrays, 10×5 arrays, etc. In some embodiments, overall array 12 is square, whereas in other embodiments array 12 is rectangular. Additionally, in some embodiments, individual shielding elements 14 are square, whereas in other embodiments elements 14 may be rectangular, triangular, other polygonal shape, circular, or ellipsoid. Shielding elements 14 are usually about 0.1 mm to 1 cm in longest dimension, in some embodiments about 0.5-5 mm. In some embodiments, shielding elements 14 have a maximum dimension of 1 to 2 mm. Shielding elements 14 are generally planar, having any suitable shape (e.g., polygonal shape, circular or ellipsoid, etc.), although in this illustrated embodiment elements 14 are rectangular or square. Shielding elements 14 are less than or equal to about 1 mm thick, and in some embodiments, less than or equal to about 100 μm (i.e., 0.1 mm) thick. Example thicknesses for shielding elements 14 include 20 μm, 50 μm and 75 μm.

In embodiments where the IC chip is a memory cell chip, only the storage elements on IC chip 10 are sensitive to magnetic fields, it is only necessary to shield the storage elements; areas void of storage elements can be unshielded. Because of this, array 10 is oriented so that the sensitive storage elements are covered by shielding elements 14 and the peripheral circuitry surrounding the storage elements are not covered by elements 14. In some embodiments, depending on the layout of IC chip 10, some peripheral circuitry (e.g., non-storage elements) may be covered by elements 14. In some embodiments, shielding elements 14 are spaced apart by less than or equal to 10% of the largest dimension of element 14 (e.g., elements 14 that are 1 mm in dimension would be spaced less than or equal to 0.1 mm apart). In other embodiments, shielding elements are spaced apart less than or equal to 5% of the largest dimension of element, sometimes less than or equal to 2%. Shielding elements 14 are, however, spaced apart at least 0.1% of the largest dimension of the element, in some embodiments at least 0.5%. Shielding elements 14 may be spaced apart, for example, 0.05 mm (50 μm), 0.1 mm (100 μm), 0.5 mm (500 μm), or 1 mm (1000 μm). In most embodiments, shielding elements 14 are spaced apart at least 0.1 mm (100 μm).

Shielding elements 14 are formed of a soft magnetic material usually having a magnetic saturation less than or equal to about 20,000 gauss, often less than or equal to 12,000 gauss. Examples of suitable soft magnetic materials for shielding elements 14 include ferrites, manganites, chromites, cobaltites, Fe, Mg, Mn, Ni, Cu, Co, and alloys thereof, such as Ni—Fe alloy. Shielding elements 14 may be all metal, or may be metal particles in a polymer matrix.

In one specific example, IC chip 10 is about 12.5 mm square, array 10 has 100 shielding elements 14 in a 10×10 array, with each shielding element 14 being 1 mm square, 50 μm thick, and is spaced from adjacent elements 14 by 0.1 mm. Based on computer modeling, a stray magnetic field of 200 Oe is reduced by this arrangement from the 200 Oe applied value to 6.6 Oe in the center region of each tile element 14. According to the modeling, the stray magnetic field does increase near the edges of tile elements 14, but is less than 10 Oe over a significant portion of the region covered by shielding elements 14. As a comparison, a single solid shield covering the entire 12.5 mm square chip would need to be more than 200 μm thick with a 20,000 gauss saturation value to be effective in a 200 Oe stray field environment. A tiled array having 100 shielding elements in a 10×10 array, with each shielding element being 1 mm square, 50 μm thick, and spaced from adjacent elements by 0.1 mm, is effective in the same 200 Oe applied field even with a much smaller saturation value of 12,000 gauss.

Figure 2:
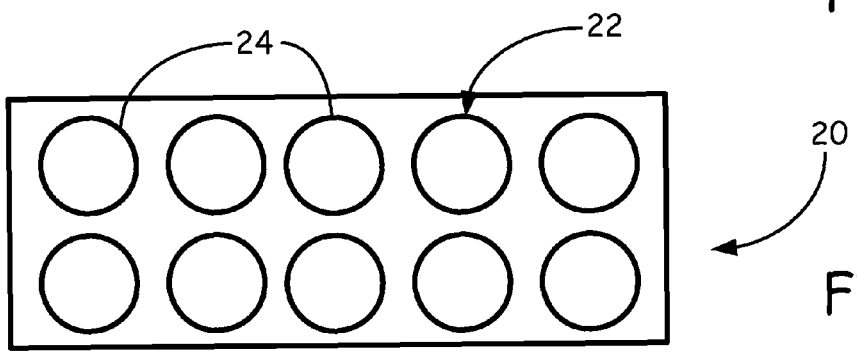
FIG. 2 is a schematic top view of a tiled array of magnetic shielding elements on an integrated chip.

FIG. 2 is a top view of another embodiment of an integrated circuit (IC) chip 20 having an array 22 of individual shielding elements 24 in close proximity. In the illustrated embodiment, array 22 is a 2×5 array of circular shielding elements 24.

Figure 3:
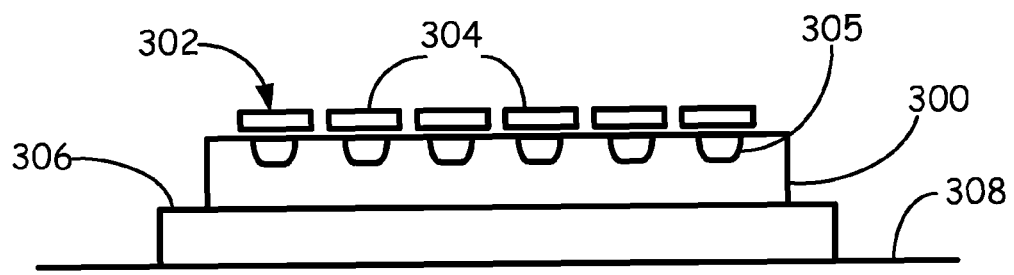
FIG. 3 is a side view of a tiled array of magnetic shielding element on an integrated chip.

FIG. 3 shows a shielded structure that has a large solid shield of permeable material below the IC chip and the tiled elements above the IC chip. IC chip 300 has a tiled array 302 of shielding elements 304 on one side of chip 300. Chip 300 includes a plurality of active or functional elements 305, such as magnetic storage elements, resistive storage elements, magnetic shift registers, or any component on an IC chip that could benefit from being shielded from unwanted fields. On the opposite site of array 302 is a solid bulk shield 306. Bulk shield 306 is positioned between chip 300 and a carrier substrate 308. Bulk shield 306 formed of a relatively hard magnetic material, harder than the soft material of shielding elements 304, usually having a magnetic saturation of at least about 20,000 gauss. Examples of suitable magnetic materials for bulk shield 306 include ferrites, manganites, chromites, cobaltites, Fe, Mg, Mn, Ni, Cu, Co, and alloys thereof.

As an example, for such a structure as in FIG. 3, Fe—Si electrical steel, at a thickness of about 20-100 μm, could be used for bulk shield 306 and an electroplated Ni—Fe alloy, at a thickness of about 20-75 μm, could be used for shielding elements 304.

The addition of an array of tiled shielding structures to a bottom shielded IC chip, such as the structure of FIG. 3, reduces the total thickness of shielding by at least 10%, often by at least 20%, often up to 50%. That is, a shielding structure composed of tiled shielding elements and a bottom bulk shield should be at least 10% thinner, often at least 20% f thinner, than a shielding structure composed of only a bottom bulk shield.

Figure 4:
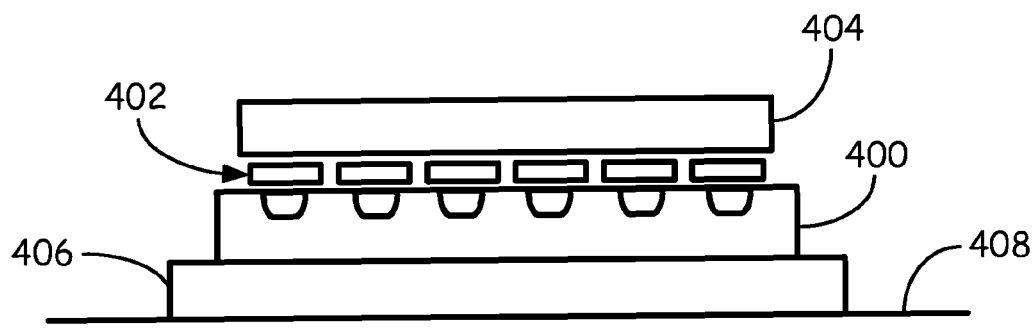
FIG. 4 is a side view of another tiled array of magnetic shielding element on an integrated chip.

Significantly greater stray field attenuation may be obtained by adding a large solid bulk shield of permeable material above the chip, in addition to below the chip. FIG. 4 shows IC chip 400 having a tiled array 402 of shielding elements and a solid bulk shield 404 on one side of chip 400. Array 402 is positioned between chip 400 and bulk shield 404. On the opposite site of array 402 and shield 304 is solid bulk shield 406. Bulk shield 406 is positioned between chip 400 and a carrier substrate 408. As an example, for such a structure, Fe—Si electrical steel, at a thickness of about 20-100 μm, could be used for upper bulk shield 404 and for lower bulk shield 406, and an electroplated Ni—Fe alloy, at a thickness of about 20-50 μm, could be used for the tiled shielding elements of array 402.

Based on computer modeling, with the structure of FIG. 4, a stray magnetic field of 200 Oe is reduced to less than 7 Oe under an individual tiled element for regions greater than 25 μm (0.025 mm) away from the edge of the tiled element, and under 1 Oe for regions greater than 225 μm (0.225 mm) from the edge of the tiled element. Although the structure of FIG. 4 is better at shielding undesired magnetic fields than the structure of FIG. 3, it is more expensive.

The addition of an array of tiled shielding structures to a top and bottom shielded IC chip, such as the structure of FIG. 4, reduces the total thickness of shielding by at least 20%, in some embodiments at least 40%, often up to 50%. That is, a shielding structure composed of tiled shielding elements, a top bulk shield and a bottom bulk shield should be at least 20% thinner, in some embodiments at least 40% thinner, than a shielding structure composed of only the same top bulk shield and a bottom bulk shield.

Figure 5:
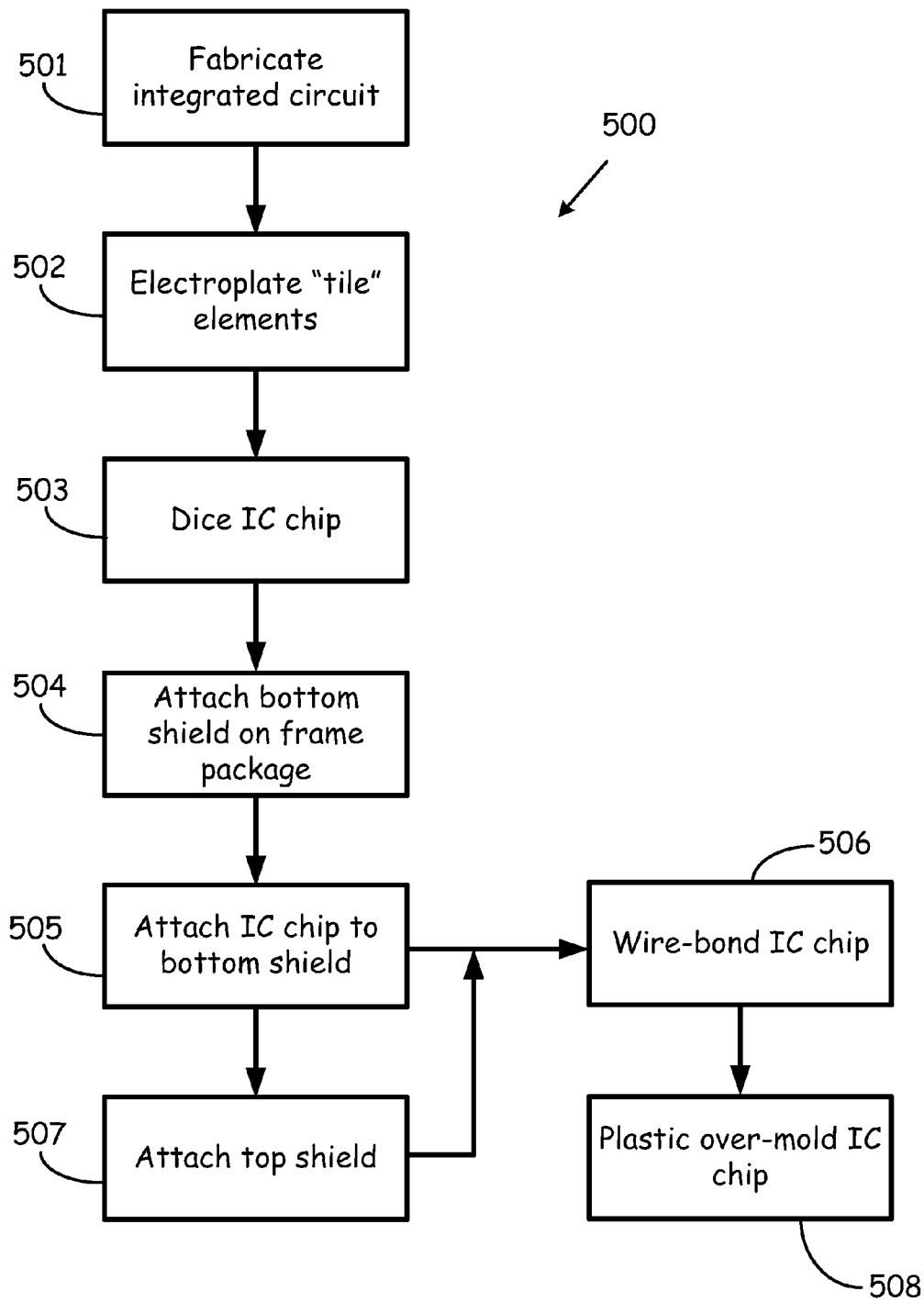
FIG. 5 is a process flow diagram for a method of shielding an integrated chip.

FIG. 5 shows an example process flow 500 for a fabrication of the magnetic shield structures shown in FIGS. 2 and 3. In Step 501, an integrated circuit (IC) is formed by conventional methods. Individual tile shielding elements (e.g., Ni—Fe alloy material at a thickness of 50 µm) are formed (e.g., electroplated) over the circuit in Step 502. By making a tiled structure of the shielding elements, the overall stress in the IC circuit and wafer may be reduced, due to the non-continuous nature of the shielding layer immediately adjacent the IC circuit. After forming the integrated circuits and positioning the shield elements over the memory elements of the circuits, the IC wafer is diced in Step 503 to form individual chips. A bottom bulk shield (e.g., a solid Fe—Si electrical steel, 100 µm thick) is attached in Step 504 first to a frame package. The chip thereafter is attached to the bottom bulk shield and frame in Step 505. To form the structure of FIG. 3, the IC chip is then wire bonded in Step 506. However, to form the structure of FIG. 4, the IC chip on the bottom bulk shield has attached thereto a top bulk shield (e.g., a solid Fe—Si electrical steel, 100 µm thick) in Step 507. After the top bulk shield, the IC chip is wire bonded in Step 506. In Step 508, the entire package is then over-molded, for example, with insulative plastic.

Thus, embodiments of the MAGNETIC SHIELDING FOR INTEGRATED CIRCUIT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A shielded integrated circuit structure comprising:
   an integrated circuit having a plurality of storage elements thereon; and
   a tiled array comprising a plurality of shielding elements comprising a magnetic material having a saturation less than or equal to 20,000 gauss, each storage element having one of the plurality of shielding elements proximate thereto.

2. The shielded integrated circuit structure of claim 1 wherein the magnetic material has a saturation less than or equal to 12,000 gauss.

3. The shielded integrated circuit structure of claim 1 wherein the shielding elements comprise ferrites, manganites, chromites, cobaltites, Fe, Mg, Mn, Ni, Cu, Co, or alloys thereof.

4. The shielded integrated circuit structure of claim 3 wherein the shielding elements comprise Ni—Fe alloy.

5. The shielded integrated circuit structure of claim 1 wherein the shielding elements are 0.1 mm to 1 cm in longest dimension.

6. The shielded integrated circuit structure of claim 1 wherein the storage elements are magnetic storage elements.

7. The shielded integrated circuit structure of claim 1 wherein the shielding elements are square.

8. The shielded integrated circuit structure of claim 1 wherein the shielding elements are less than or equal to 0.1 mm thick.

9. The shielded integrated circuit structure of claim 1 wherein each shielding element is spaced from an adjacent shielding element by at least 0.1 mm.

10. The shielded integrated circuit structure of claim 1 further comprising a solid bulk shield on a side of the integrated circuit opposite the tiled array.

11. The shielded integrated circuit structure of claim 10 further comprising a second solid bulk shield, with the tiled array positioned between the integrated circuit and the second solid bulk shield.

12. A shielded integrated circuit structure comprising:
    a substrate;
    a solid bulk shield proximate the substrate;
    an integrated circuit having a plurality of storage elements thereon; and
    a tiled array comprising a plurality of shielding elements comprising a magnetic material having a saturation less than or equal to 20,000 gauss, each storage element having one of the plurality of shielding elements proximate thereto, and each shielding element spaced from an adjacent shielding element by at least 0.1 mm.

13. The shielded integrated circuit structure of claim 12 wherein the magnetic material has a saturation less than or equal to 12,000 gauss.

14. The shielded integrated circuit structure of claim 12 further comprising a second solid bulk shield, with the tiled array positioned between the integrated circuit and the second bulk shield.

15. The shielded integrated circuit structure of claim 12 wherein the shielding elements comprise ferrites, manganites, chromites, cobaltites, Fe, Mg, Mn, Ni, Cu, Co, or alloys thereof.

16. The shielded integrated circuit structure of claim 15 wherein the shielding elements comprise Ni—Fe alloy.

17. A shielded integrated circuit structure comprising:
    an integrated circuit having a plurality of functional elements thereon; and
    a tiled array comprising a plurality of shielding elements comprising a magnetic material having a saturation less than or equal to 20,000 gauss, each functional element having one of the plurality of shielding elements proximate thereto.

18. The shielded integrated circuit structure of claim 17 wherein the shielding elements comprise ferrites, manganites, chromites, cobaltites, Fe, Mg, Mn, Ni, Cu, Co, or alloys thereof.

19. The shielded integrated circuit structure of claim 17 further comprising a solid bulk shield on a side of the integrated circuit opposite the tiled array.

20. The shielded integrated circuit structure of claim 19 further comprising a second solid bulk shield, with the tiled array positioned between the integrated circuit and the second solid bulk shield.

* * * * *